(12) United States Patent
Shin et al.

(10) Patent No.: US 11,770,946 B2
(45) Date of Patent: Sep. 26, 2023

(54) WINDOW AND DISPLAY DEVICE HAVING THE SAME

(71) Applicant: Samsung Display Co., Ltd., Yongin-si (KR)

(72) Inventors: Heonjung Shin, Hwaseong-si (KR); Jeoungsub Lee, Seoul (KR); Hyun Joon Oh, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 254 days.

(21) Appl. No.: 16/926,745

(22) Filed: Jul. 12, 2020

(65) Prior Publication Data

US 2021/0083220 A1    Mar. 18, 2021

(30) Foreign Application Priority Data

Sep. 18, 2019  (KR) .................. 10-2019-0114590

(51) Int. Cl.
| | | |
|---|---|---|
| *H01L 51/52* | (2006.01) | |
| *H10K 50/84* | (2023.01) | |
| *G02B 1/14* | (2015.01) | |
| *B32B 27/28* | (2006.01) | |
| *B32B 27/06* | (2006.01) | |
| *B32B 7/12* | (2006.01) | |
| *H10K 59/12* | (2023.01) | |
| *H10K 59/40* | (2023.01) | |

(Continued)

(52) U.S. Cl.
CPC ............ *H10K 50/841* (2023.02); *B32B 7/12* (2013.01); *B32B 27/06* (2013.01); *B32B 27/281* (2013.01); *G02B 1/14* (2015.01); *H10K 59/12* (2023.02); *H10K 59/40* (2023.02); *H10K 77/111* (2023.02); *B32B 2255/10* (2013.01); *B32B 2307/304* (2013.01); *B32B 2457/206* (2013.01); *H10K 2102/311* (2023.02)

(58) Field of Classification Search
None
See application file for complete search history.

(56) References Cited

U.S. PATENT DOCUMENTS

| | | |
|---|---|---|
| 9,317,067 B2 | 4/2016 | Choi et al. |
| 9,914,811 B2 | 3/2018 | Song et al. |
| 10,005,264 B2 | 6/2018 | Leatherdale et al. |

(Continued)

FOREIGN PATENT DOCUMENTS

| | | |
|---|---|---|
| KR | 10-2015-0060161 | 6/2015 |
| KR | 10-2016-0061324 | 5/2016 |

(Continued)

*Primary Examiner* — Anthony J Frost
(74) *Attorney, Agent, or Firm* — H.C. Park & Associates, PLC

(57) ABSTRACT

A window for a display device includes: a film having flexibility; and at least one coating layer disposed on the film. As tensile stress acting on the film increases, the film is elastically deformed in a first range of strains of the film and plastically deformed in a second range of strains of the film greater than the first range, the first and second ranges being defined by a relationship between the tensile stress and a strain of the film in accordance with the tensile stress. The film has a yield strain in a third range from about 1.9% to about 2.25%, and the yield strain is defined as the strain of the film when a yield stress of the relationship in the first range is applied to the film.

18 Claims, 10 Drawing Sheets

(51) Int. Cl.
*H10K 77/10* (2023.01)
*H10K 102/00* (2023.01)

(56) References Cited

U.S. PATENT DOCUMENTS

| | | | |
|---|---|---|---|
| 2013/0127606 A1* | 5/2013 | Chang | G09G 3/006 |
| | | | 340/384.7 |
| 2016/0185926 A1* | 6/2016 | Song | C08J 7/0427 |
| | | | 428/447 |
| 2017/0183462 A1* | 6/2017 | Song | C09J 7/25 |
| 2019/0036048 A1 | 1/2019 | Lee et al. | |

FOREIGN PATENT DOCUMENTS

| | | |
|---|---|---|
| KR | 10-2016-0079549 | 7/2016 |
| KR | 10-2017-0076171 | 7/2017 |
| KR | 10-2018-0085045 | 7/2018 |
| KR | 10-2019-0014185 | 2/2019 |

* cited by examiner

WINDOW AND DISPLAY DEVICE HAVING THE SAME

CROSS-REFERENCE TO RELATED APPLICATION

This application claims priority from and the benefit of Korean Patent Application No. 10-2019-0114590, filed on Sep. 18, 2019, which is hereby incorporated by reference for all purposes as if fully set forth herein.

BACKGROUND

Field

Exemplary implementations of the invention relate generally to a window and a display device having the same and, more specifically, to a flexible window and a flexible display device having the same.

Discussion of the Background

In general, electronic devices providing an image to a user, such as a smart phone, is a digital camera, a notebook computer, a navigation system, a smart television, etc., include a display device to display the image. The display device generates the image and provides the image to the user through a display screen.

In recent years, various types of display devices are being developed with technical improvements in the display devices. For example, various flexible display devices that are deformable in a curved shape, bendable, or rollable are being developed. The flexible display devices are easy to carry and improve a user's convenience.

The flexible display devices include a window disposed thereabove to protect a display surface thereof. The window protects the display surface from external scratches and impacts. The window is transparent to transmit the image from the flexible display device to the user, and is flexible and is deformed when the flexible display device is deformed.

The above information disclosed in this Background section is only for understanding of the background of the inventive concepts, and, therefore, it may contain information that does not constitute prior art.

SUMMARY

Applicant realized that when flexible display devices are repeatedly folded and unfolded, the window may have a deformed portion even when the flexible display device is unfolded, which may be visible to the user depending on the strain of the deformed portion.

Windows for display devices and display devices constructed according to the principles and exemplary implementations of the invention are capable of preventing or reducing deformation of a repeatedly folded portion from being perceived from the outside. For example, the window may include a foldable portion having a reduced strain amount when unfolded.

Additional features of the inventive concepts will be set forth in the description which follows, and in part will be apparent from the description, or may be learned by practice of the inventive concepts.

According to one aspect of the invention, a window for a display device includes: a film having flexibility; and at least one coating layer disposed on the film, wherein: as tensile stress acting on the film increases, the film is elastically deformed in a first range of strains of the film and plastically deformed in a second range of strains of the film greater than the first range, the first and second ranges being defined by a relationship between the tensile stress and a strain of the film in accordance with the tensile stress; and the film has a yield strain in a third range from about 1.9% to about 2.25%, and the yield strain is defined as the strain of the film when a yield stress of the relationship in the first range is applied to the film.

The film may have a plastic index equal to or greater than about 0.5, and the plastic index may be defined by a value obtained by dividing a plastic modulus that is defined by a slope in the second range by an elastic modulus that is defined by a slope in the first range.

The plastic modulus may be defined by a slope at a designated strain selected from the second range, and the designated strain may be set to a value in a fourth range from the yield strain to the strain of the film which is about 2.75%.

The fourth range may include a fifth range of strains of the film which is from about 2.25% to about 2.75%.

The film may have a restoration rate in a range from about 85% to about 100% after a tensile stress is applied to the film multiple times, the restoration rate may be defined by a numerical value obtained by dividing a restoration strain by a first set strain, and the restoration strain may be defined by a value obtained by subtracting the strain of the film, which is measured after the tensile stress is applied multiple times, from the first set strain.

The film may have a creep strain in a range from about 0% to about 20% when a stress is applied to the film during a first predetermined time and the stress is released after the first predetermined time, the creep strain may be defined by a numerical value obtained by dividing an additional strain by a second set strain, and the additional strain may be defined as a variation of the strain of the film in response to the stress being continuously applied.

The film may have a creep residual strain in a range from about 0% to about 20%, the creep residual strain may be defined by a numerical value obtained by dividing a residual strain by the second set strain, and the residual strain may be defined as the strain of the film after a second predetermined time elapses after the stress is released.

The film may include at least one monomer of oxydiphthalic anhydride (ODPA), pyromellitic dianhydride (PMDA), oxy diphthalic anhydride (ODA), bis-aminophenoxy biphenyl (BAPB), and bis-amino phenoxy phenylsulfone (BAPS).

The film may include at least one polymer of polyimide (PI), polyethylene terephthalate (PET), polycarbonate (PC), and polymethyl methacrylate (PMMA).

According to another aspect of the invention, a display device includes: a display panel; and a transparent protector disposed on the display panel, the transparent protector including: a film having a flexibility; and at least one coating layer disposed on the film, wherein: as tensile stress acting on the film increases, the film is elastically deformed in a first range of strains of the film and plastically deformed in a second range of strains of the film greater than the first range, the first and second ranges being defined by a relationship between the tensile stress and a strain of the film in accordance with the tensile stress; and the film has a yield strain in a third range from about 1.9% to about 2.25%, and the yield strain is defined as the strain of the film when a yield stress of the first range is applied to the film.

The film may have a plastic index equal to or greater than about 0.5, and the plastic index may be defined by a value obtained by dividing a plastic modulus that is defined by a slope in the second range by an elastic modulus defined by a slope in the first range.

The plastic modulus may be defined by a slope at a designated strain selected from the second range, and the designated strain may be set to a value in a fourth range from the yield strain to the strain of the film which is about 2.75%.

The fourth range may include a fifth range of strains of the film which is from about 2.25% to about 2.75%.

The film may have a restoration rate in a range from about 85% to about 100% after a tensile stress is applied to the film multiple times, the restoration rate may be defined by a numerical value obtained by dividing a restoration strain by a first set strain, and the restoration strain may be defined by a value obtained by subtracting the strain of the film, which is measured after the tensile stress is applied multiple times, from the first set strain.

The film may have a creep strain in a range from about 0% to about 20% when a stress is applied to the film during a first predetermined time and the stress is released after the first predetermined time, the creep strain may be defined by a numerical value obtained by dividing an additional strain by a second set strain, and the additional strain may be defined as a variation of the strain of the film in response to the stress being continuously applied.

The film may have a creep residual strain in a range from about 0% to about 20%, the creep residual strain may be defined by a numerical value obtained by dividing a residual strain by the second set strain, and the residual strain may be defined as the strain of the film after a second predetermined time elapses after the stress is released.

The yield strain may be the maximum value in the first range of strains of the film.

The transparent protector may include a window and the film may include a window film.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
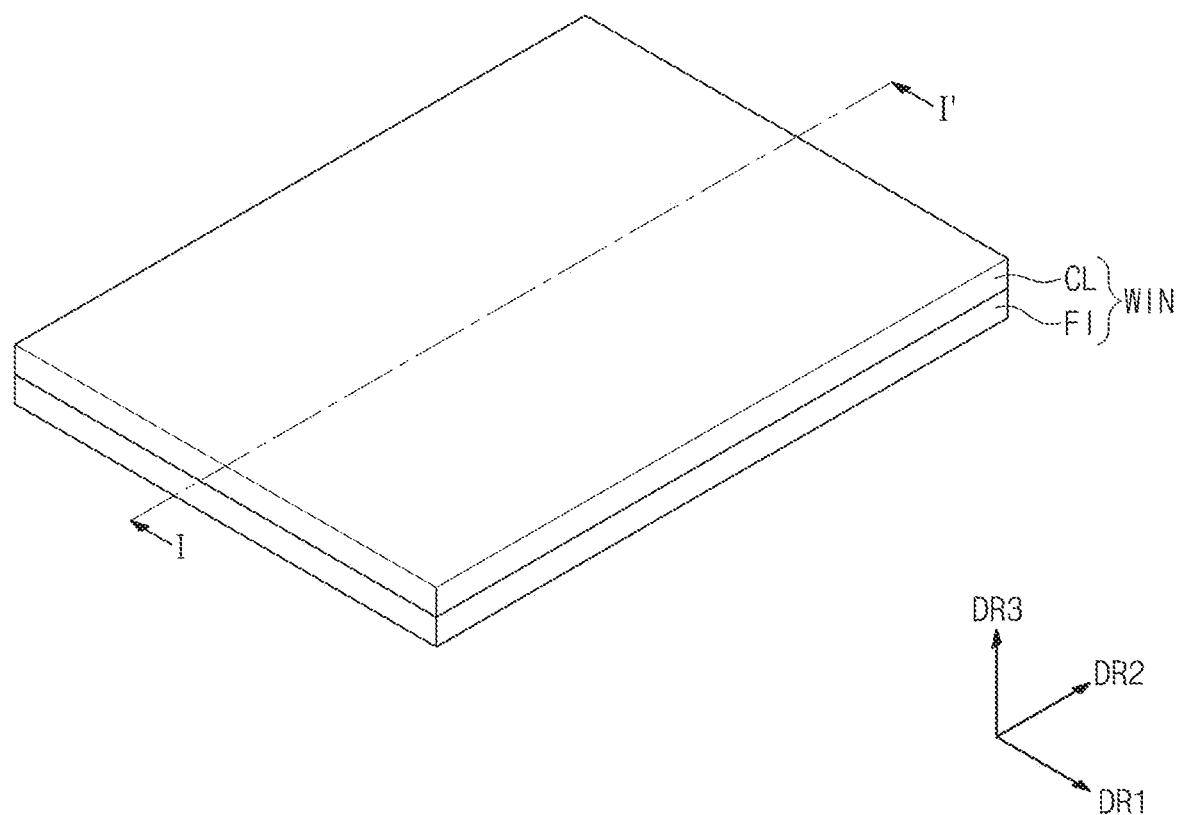
FIG. 1 is a perspective view of an exemplary embodiment of a window constructed according to the principles of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the is inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the is group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," is when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
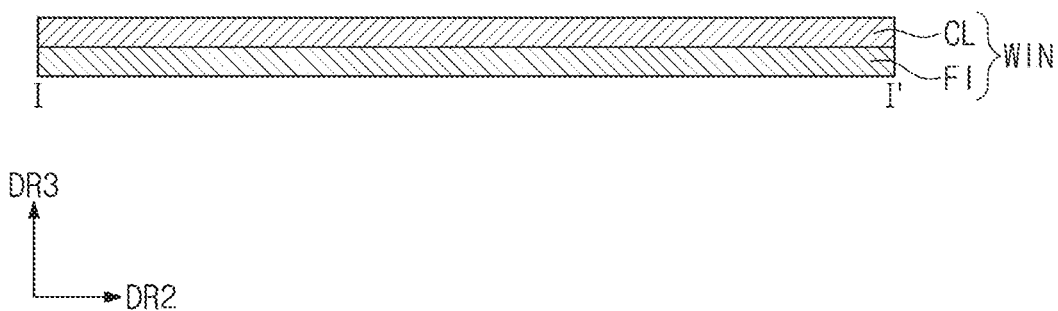
FIG. 2 is a cross-sectional view taken along line I-I' of FIG. 1.

FIG. 1 is a perspective view of an exemplary embodiment of a window is constructed according to the principles of the invention. FIG. 2 is a cross-sectional view taken along line I-I' of FIG. 1.

Referring to FIGS. 1 and 2, a transparent protector in the form of a window WIN may include a coating layer CL and a protective film that may be in the form of a window film FI. The coating layer CL may be disposed on the window WIN. The coating layer CL may include a plane defined by a first direction DR1 and a second direction DR2 intersecting the first direction DR1.

Hereinafter, a direction substantially perpendicular to the plane defined by the first and second directions DR1 and DR2 may be defined as a third direction DR3. In the following descriptions, "when viewed in a plan view" is an expression which means "when viewed in the third direction DR3".

The coating layer CL may have a substantially rectangular shape when viewed in a plan view. However, the shape of the coating layer CL should not be limited to the rectangular shape.

The coating layer CL may be a flexible and/or bendable coating layer. For example, the coating layer CL may be bent or folded by an external force. When the external force applied to the coating layer CL disappears, the coating layer CL may return to its original shape. In an exemplary embodiment, the coating layer CL may be implemented in a single-layer structure, however, exemplary embodiments are not limited thereto or thereby. The coating layer CL may have a plurality of coating layers.

The window film FI may be disposed under the coating layer CL. The window film FI may include a plane defined by the first direction DR1 and the second direction DR2. When viewed in a plan view, the window film FI may have a substantially rectangular shape. However, the shape of the window film FI should not be limited to the rectangular shape.

The window film FI may be a flexible and/or bendable film. For example, the window film FI may be bent or folded by an external force. When the external force applied to the window film FI disappears, the window film FI may return to its original shape.

The window film FI may have a high transmittance and a low turbidity. For example, the window film FI may have the transmittance equal to or greater than about 85% and the turbidity equal or smaller than about 3%.

The window film FI may be a polymer having at least one monomer of oxydiphthalic anhydride (ODPA), pyromellitic dianhydride (PMDA), oxy diphthalic anhydride (ODA), bis-aminophenoxy biphenyl (BAPB), and bis-amino phenoxy phenylsulfone (BAPS). For example, the window film FI may be a polymer, such as polyimide (PI), polyethylene terephthalate (PET), polycarbonate (PC), polymethyl methacrylate (PMMA), or the like. However, the material for the window film FI should not be limited thereto or thereby.

The window film FI may be manufactured by an extrusion molding method or a solution softening method.

The window film FI may have material properties suitable for a flexible display device. The window film FI may have certain material properties as described herein that reduce its deformation, and therefore, the deformation may not be perceived by a viewer. For example, the window WIN including the window film FI having the certain material properties may be folded at its foldable portion, and the deformation of the foldable portion may not be perceived by the viewer when the foldable portion is unfolded after being folded. The material properties of the window film may be tested using the same product having the same configuration as the window film FI of FIG. 1. Hereinafter, the material properties will be described in detail.

Figure 3:
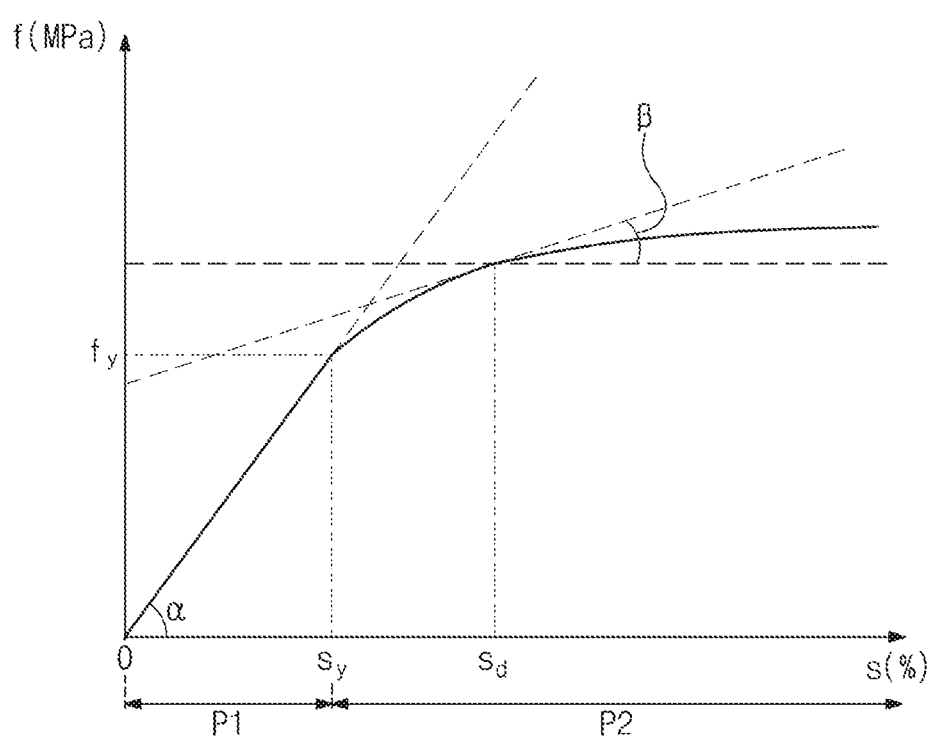
FIGS. 3 to 5 are graphs illustrating results of first to third material property tests for the window film of FIG. 1 according to the principles of the invention.
Figure 4:
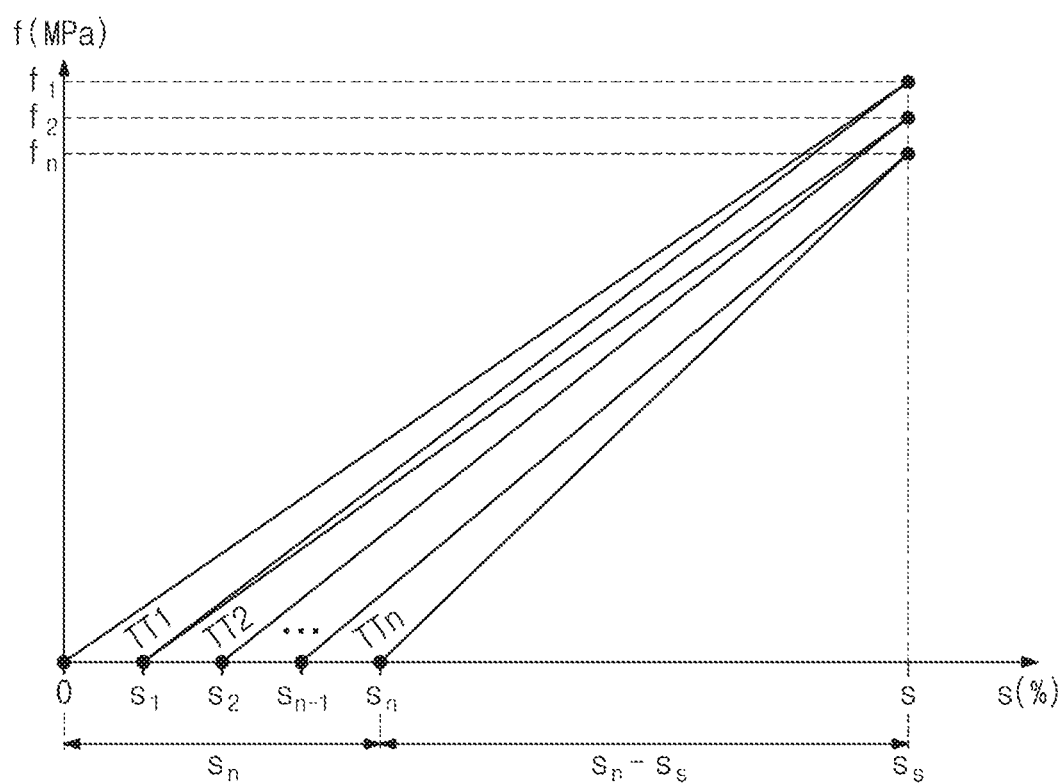
Figure 5:
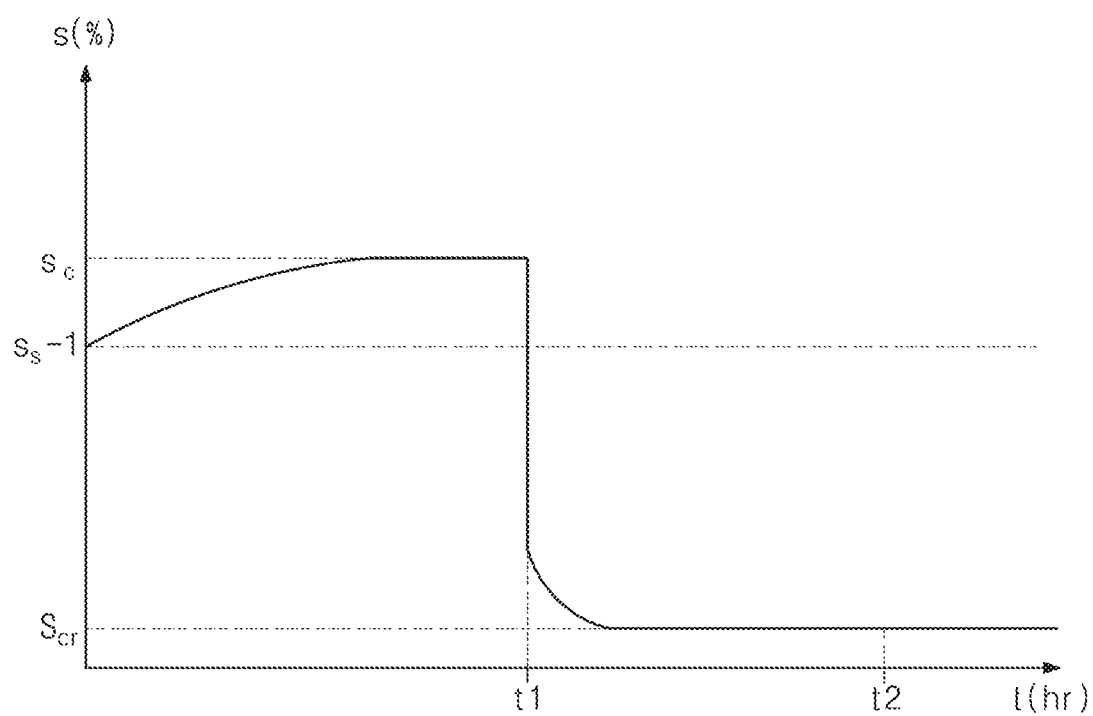

FIGS. 3 to 5 are graphs illustrating results of first to third material property tests for the window film of FIG. 1 according to the principles of the invention.

Referring to FIG. 3, an X-axis and a Y-axis respectively denote a strain s of the window film FI and a stress f acting on the window film FI. The units of the strain s and the stress f are % and MPa, respectively. The stress f may be tensile stress. The strain s may be measured based on the shape of the window film FI before the stress f is applied. For example, the strain s may be determined by comparing the shape of the window film FI after the stress f is applied to the window film FI with the shape of the window film FI before the stress f is applied.

The first material property test may be a test that applies the stress f to the window film FI. The stress may gradually increase in the first material property test.

Referring to FIG. 3, the window film FI may be elastically deformed in a first range P1 and may be plastically deformed in a second range P2 as the stress f acting on the window film FI increases.

The first range P1 may be defined as a range of strains of the window film FI or a range of stresses applied to the window film FI in which the window film FI is elastically deformed depending on the stress f. For example, the strain s of the window film FI may have a linear relationship with the stress f in the first range P1. The second range P2 may be defined as a range of strains of the window film FI or a range of stresses applied to the window film FI in which the window film FI is plastically deformed depending on the stress f. For example, the strain s of the window film FI may have a nonlinear relationship with the stress f in the second range P2. The second range P2 may be greater than the first range P1.

A yield stress $f_y$ may be a maximum value in the first range P1 and may be defined as a maximum tensile stress in the first range P1. The stress f acting on the window film FI in the first range P1 may be equal to or smaller than the yield stress $f_y$, and the stress f acting on the window film FI in the second range P2 may be greater than the yield stress $f_y$.

A yield strain $s_y$ may be defined as the strain s of the window film FI when the yield stress $f_y$ acts on the window film FI. The yield strain $s_y$ may be the maximum value in the first range P1. According to an exemplary embodiment, the yield strain $s_y$ of the window film FI may be equal to or greater than about 1.9%, and preferably, may be in a range from about 1.9% to about 2.25%.

A slope in the first range P1 may be defined as an elastic modulus. A slope in the second range P2 may be defined as a plastic modulus.

As described above, the strain s and the stress f may have a linear relationship in the first range P1. Accordingly, the elastic modulus tan($\alpha$) may have a constant value in the first range P1. The strain s and the stress f may have the nonlinear relationship in the second range P2. Accordingly, the plastic modulus tan($\beta$) may vary in the second range P2.

In an exemplary embodiment, a designated strain sa is defined to specify the plastic modulus tan($\beta$). The designated strain sa may be defined as a strain at a specific point of the second range P2. In detail, the designated strain sa may be set to a specific strain in a strain range from the yield strain $s_y$ to the strain s of the window film FI, which is about 2.75%. Preferably, the designated strain sa may be set to the specific strain in a strain range from about 2.25% to about 2.75%.

A plastic index of the window film FI may be defined by a value obtained by dividing the plastic modulus tan($\beta$) by the elastic modulus tan($\alpha$). The plastic index according to an exemplary embodiment may be equal to or greater than about 0.5.

Consequently, the window film FI according to the illustrated exemplary is embodiment may have the yield strain that is equal to or greater than about 1.9% (preferably, equal to greater than about 1.9% and equal to or smaller than about 2.25%) in the first material property test. In addition, the plastic index of the window film FI in the first material property test may be equal to or greater than about 0.5.

Referring to FIG. 4, an X-axis and a Y-axis respectively denote a strain s of the window film FI and a stress f acting on the window film FI. The units of the strain s and the stress f are % and MPa, respectively. The stress f may be tensile stress. The strain s may be measured based on the shape of the window film FI before the stress f is applied.

The second material property test may include a plurality of tensile tests. In each tensile test, the stress f may be applied until the strain s of the window film FI reaches a first set strain $s_s$. In detail, a first tensile test TT1 may proceed as follows.

The stress f is applied to the window film FI. The strain s of the window film FI may be zero (0) before the stress f is applied.

The stress f increases until the strain s of the window film FI reaches the first set strain $s_s$. When the stress f increases to a first stress f1, the strain s of the window film FI may reach the first set strain $s_s$.

The stress f is released. The strain s of the window film FI when the stress f becomes zero (0) is defined as a first strain $s_1$. The first strain $s_1$ may be greater than zero (0).

Then, a second tensile test TT2 proceeds.

The stress f is applied to the window film FI again. The strain s of the window film FI is the first strain $s_1$ before the stress f is applied.

The stress f increases until the strain s of the window film FI reaches the first set strain $s_s$ from the first strain $s_1$. When the stress f increases to a second stress f2, the strain s of is the window film FI may reach the first set strain $s_s$. The second stress f2 may be smaller than the first stress f1.

The stress f is released. The strain s of the window film FI when the stress f becomes zero (0) is defined as a second strain $s_2$. The second strain $s_2$ may be greater than the first strain $s_1$.

When an n-th tensile test TTn is finished, the strain s of the window film FI is defined as an n-th strain $s_n$. In an exemplary embodiment, n may be 1000, however, it should not be limited thereto or thereby.

After the plural tensile tests are finished, the restoration strain of the window film FI may be defined by a value obtained by subtracting the n-th strain $s_n$ from the first set strain $s_s$.

According to an exemplary embodiment, the restoration rate may be defined by a numerical value obtained by dividing the restoration strain by the first set strain $s_s$. Expressing the restoration rate as a formula, the restoration rate may be defined by the following formula of $(s_s - s_n)/(s_s) \times 100\%$. According to an exemplary embodiment, the restoration rate of the window film FI may be in a range from about 85% to about 100%. For example, in the case where the first set strain $s_s$ is about 2%, the n-th strain $s_n$ may be in a range from about 0% to about 0.3%.

Consequently, the restoration rate of the window film FI may be in the range from about 85% to about 100% in the second material property test.

Referring to FIG. 5, an X-axis and a Y-axis respectively denote a time t and a strain s of the window film FI. The units of the time t and the strain s are hour and %, respectively. The strain s may be measured based on the shape of the window film FI before the third material property test is performed.

Referring to FIG. 5, in the third material property test, the stress f may be is continuously applied to the window film FI until a first time point t1, and the stress f applied to the window film FI may be released after the first time point t1. The stress f applied to the window film FI may have a constant level in the third material property test.

The strain s of the window film FI may reach a second set strain $s_s-1$ by the stress f. The second set strain $s_s-1$ may have substantially the same value as the first set strain $s_s$.

The strain s of the window film FI may increase to a maximum strain $s_c$ from the second set strain $s_s-1$ as the stress f is maintained until the first time point t1. The strain s of the window film FI may further increase by a value obtained by subtracting the second set strain $s_s-1$ from the maximum strain $s_c$. Such a variation of the strain s of the window film FI may be defined as an additional strain. In an exemplary embodiment, the first time point t1 is set to 1 hour from a time point when the stress starts to be applied, however, the first time point t1 should not be limited thereto or thereby.

A creep strain may be defined by a numerical value obtained by dividing the additional strain by the second set strain $s_s-1$. Expressing the creep strain as a formula, the creep strain may be defined by the following formula of $(s_c-s_s-1)/s_s-1\times 100\%$. According to an exemplary embodiment, the creep strain of the window film FI may be in a range from about 0% to about 20%. For example, in the case where the second set strain $s_s-1$ is about 2%, the maximum strain $s_c$ may be equal to or smaller than about 2.4%.

As the stress f is released at the first time point t1, the window film FI may be restored. The strain s of the window film FI may decrease to a residual strain $s_{cr}$ at a second time point t2. In an exemplary embodiment, the second time point t2 is set to 1 hour from a time point when the stress is released, i.e., the first time point t1, however, the second time point t2 should not be limited thereto or thereby.

The creep residual strain may be defined by a numerical value obtained by dividing the residual strain $s_{cr}$ by the second set strain $s_s-1$. As a formula, the creep residual strain may be defined by the following formula of $s_{cr}/s_s-1\times 100\%$. According to an exemplary embodiment, the creep residual strain of the window film FI may be in a range from about 0% to about 20%. For example, in the case where the second set strain $s_s-1$ is about 2%, the residual strain $s_{cr}$ may be equal to or smaller than about 0.4%.

Consequently, according to the illustrated exemplary embodiment, the creep strain of the window film FI may be in a range from about 0% to about 20%. In addition, the creep residual strain of the window film FI may be in a range from about 0% to about 20%.

According to an exemplary embodiment, the window film FI satisfies the following material property conditions.

Yield strain: a range from about 1.9% to about 2.25%
Plastic index: equal to or greater than about 0.5
Restoration rate: a range from about 85% to about 100%
Creep strain: a range from about 0% to about 20%
Creep residual strain: a range from about 0% to about 20%

A window film that satisfies the above material property conditions may be suitable for application to the flexible display device. The window film having these material properties reduces the deformation that may exist when the flexible display device is repeatedly folded and unfolded. Accordingly, the deformation of the window film of the flexible display device may be prevented from being perceived from a viewer when the flexible display device is unfolded. This will be described in detail together with experimental data. The window film that satisfies the above material property conditions may be provided under the coating layer to is manufacture the window as shown in FIG. 1.

Figure 6:
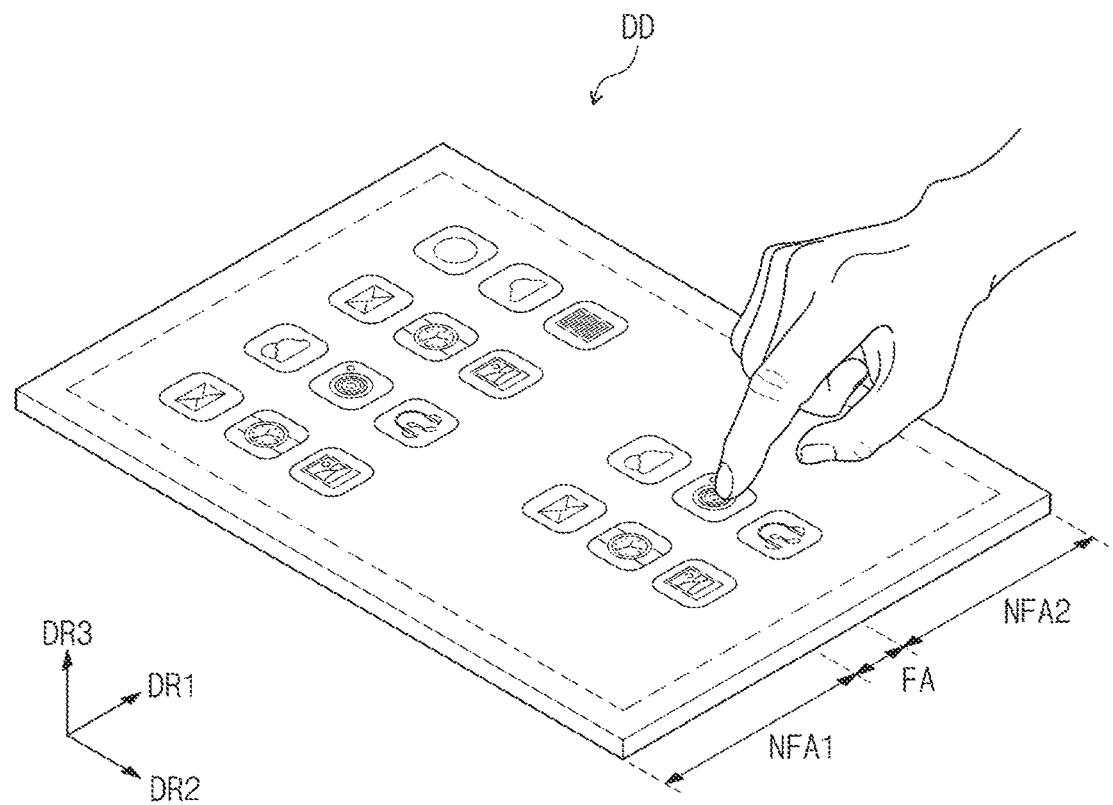
FIG. 6 is a perspective view of an exemplary embodiment of a display device including the window of FIG. 1.
Figure 7:
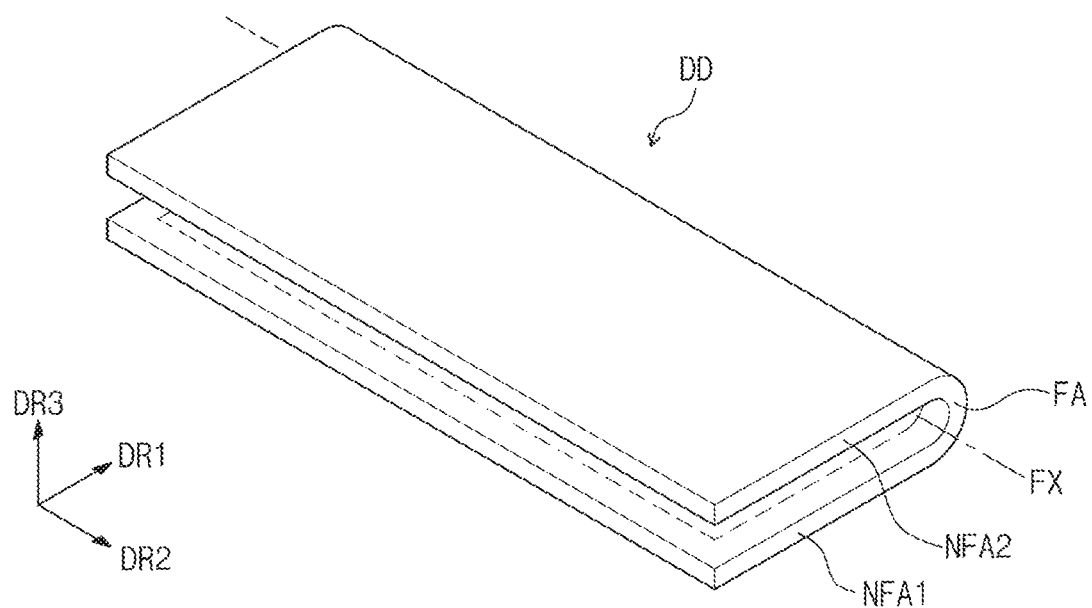
FIG. 7 is a perspective view of a folded position of the display device of FIG. 6.

FIG. 6 is a perspective view of an exemplary embodiment of a display device including the window of FIG. 1. FIG. 7 is a perspective view of a folded position of the display device of FIG. 6.

Referring to FIG. 6, a display device DD may have a substantially rectangular shape having short sides in the first direction DR1 and long sides in the second direction DR2 intersecting the first direction DR1, however, it should not be limited thereto or thereby. The display device DD may have various shapes, such as a circular shape, a polygonal shape, etc. The display device DD may be, but is not limited to, a flexible display device.

The display device DD may include a foldable area FA and a plurality of non-foldable areas NFA1 and NFA2. The non-foldable areas NFA1 and NFA2 may include a first non-foldable area NFA1 and a second non-foldable area NFA2. The foldable area FA may be disposed between the first non-foldable area NFA1 and the second non-foldable area NFA2. The foldable area FA, the first non-foldable area NFA1, and the second non-foldable area NFA2 may be arranged in the first direction DR1.

In an exemplary embodiment, one foldable area FA and two non-foldable areas NFA1 and NFA2 are shown as a representative example, however, the number of the foldable areas FA and the number of the non-foldable areas NFA1 and NFA2 should not be limited thereto or thereby. For example, the display device DD may include more than two non-foldable areas and a plurality of foldable areas disposed between more than two non-foldable areas.

Referring to FIG. 7, the display device DD may be a foldable display device that can be folded or unfolded. For example, the foldable area FA may be folded about a folding axis FX substantially parallel to the second direction DR2, and thus, the display device DD may be is folded. The folding axis FX may be defined as a long axis substantially parallel to the long sides of the display device DD.

When the display device DD is folded, the first non-foldable area NFA1 and the second non-foldable area NFA2 face each other, and the display device DD may be inwardly folded (in-folding) such that the display surface is not exposed to the outside.

Figure 8:
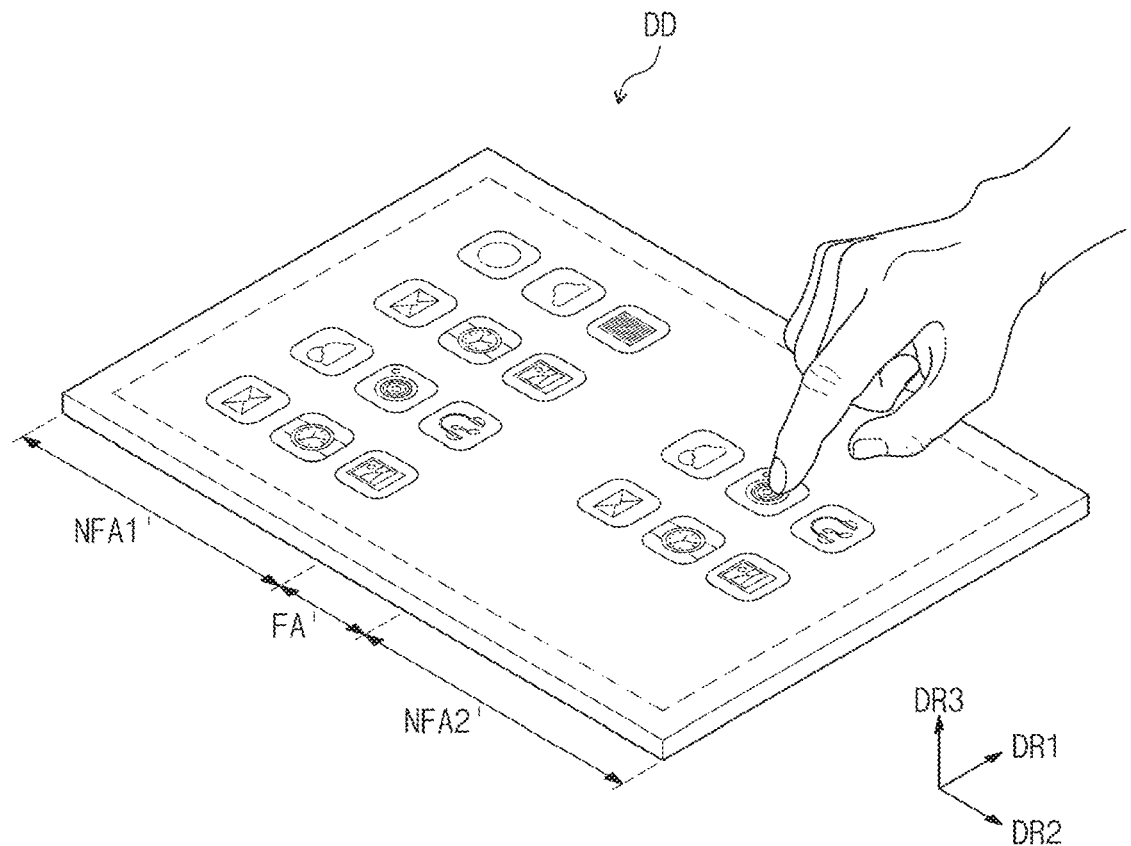
FIG. 8 is a perspective view of an exemplary embodiment of a display device including the window of FIG. 1.
Figure 9:
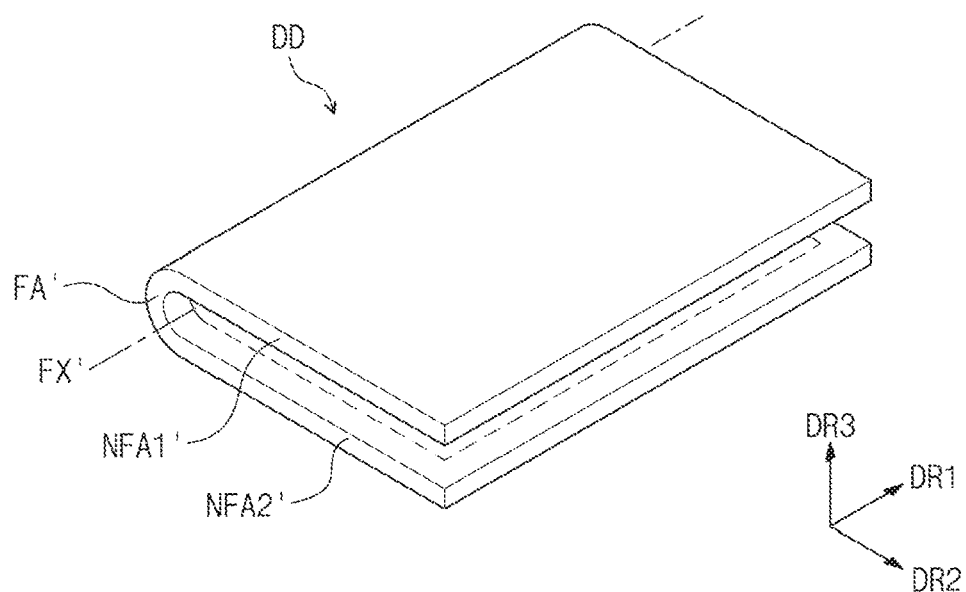
FIG. 9 is a perspective view of a folded position of the display device of FIG. 8.

FIG. 8 is a perspective view of an exemplary embodiment of a display device including the window of FIG. 1. FIG. 9 is a perspective view of a folded position of the display device of FIG. 8.

Referring to FIGS. 8 and 9, a display device DD may include a foldable area FA' and a plurality of non-foldable areas NFA1' and NFA2'. The non-foldable areas NFA1' and NFA2' may include a first non-foldable area NFA1' and a second non-foldable area NFA2'. The foldable area FA' may be disposed between the first non-foldable area NFA1' and the second non-foldable area NFA2'. The foldable area FA', the first non-foldable area NFA1', and the second non-foldable area NFA2' may be arranged in the second direction DR2.

The foldable area FA' may be folded about a folding axis FX' substantially parallel to the first direction DR1, and thus, the display device DD may be folded. The folding axis FX' may be defined as a short axis substantially parallel to the short sides of the display device DD.

The display device DD shown in FIG. 6 may be folded about the long axis, whereas the display device DD shown in FIG. 8 may be folded about the short axis. The display device DD may be inwardly folded (in-folding) such that the display surface is not exposed to the outside.

Figure 10:
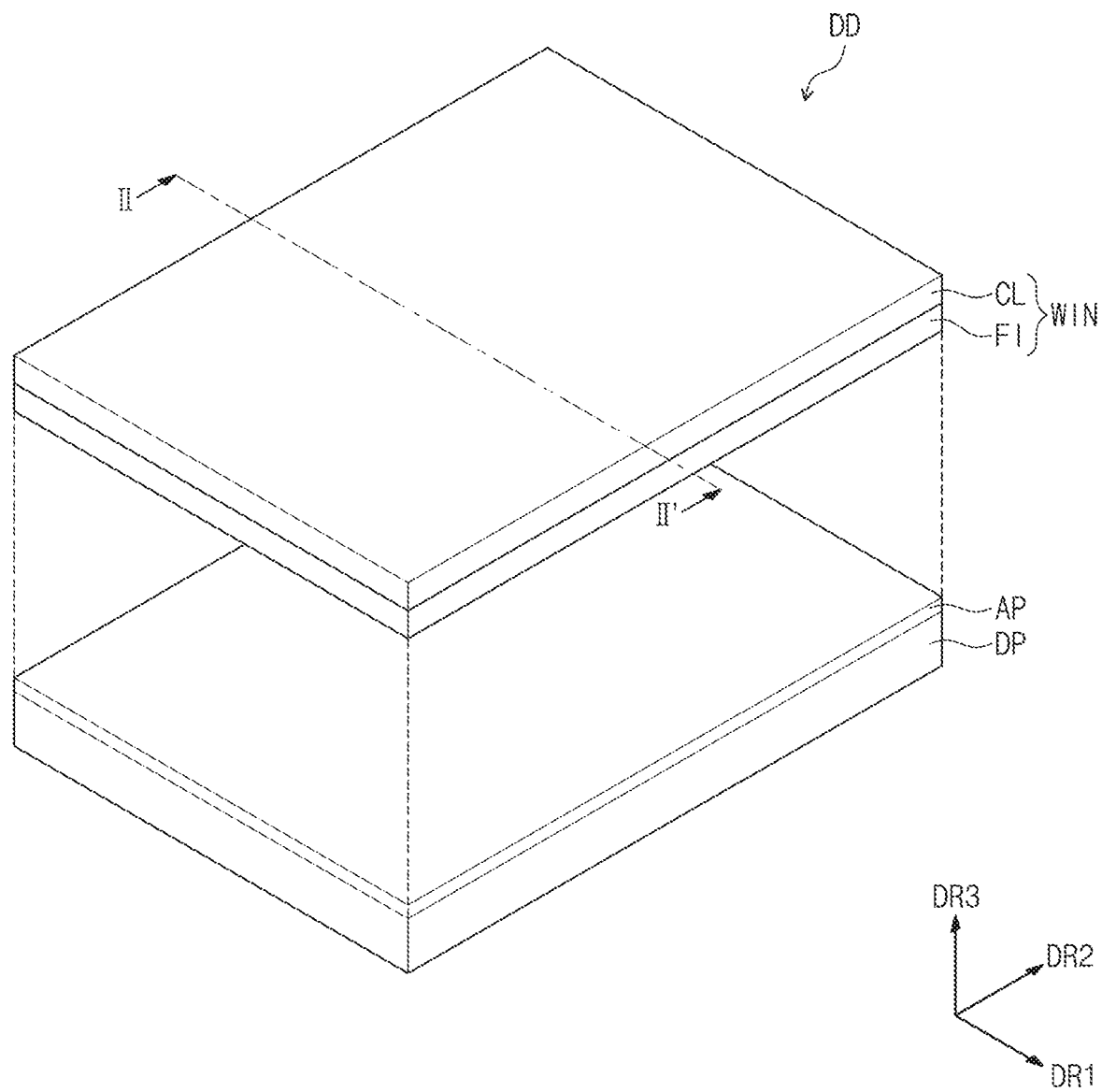
FIG. 10 is an exploded perspective view of a display device including the window of FIG. 1 constructed according to the principles of the invention.
Figure 11:
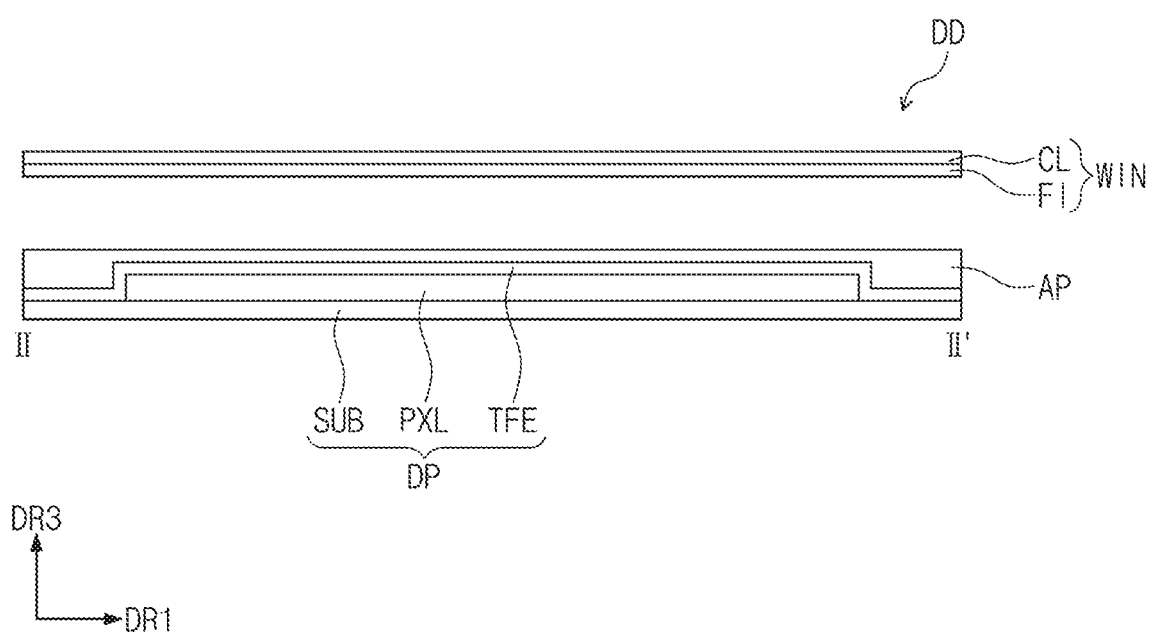
FIG. 11 is a cross-sectional view taken along line II-II' of FIG. 10.

FIG. 10 is an exploded perspective view of a display device including the window is of FIG. 1 constructed according to the principles of the invention. FIG. 11 is a cross-sectional view taken along line II-II' of FIG. 10. For the convenience of explanation, a window WIN and a display panel DP are shown separately from each other in FIGS. 10 and 11. The window WIN shown in FIGS. 10 and 11 may be the window WIN shown in FIG. 1. Hereinafter, descriptions of the window WIN will be omitted to avoid redundancy, and the structure of the display panel will be mainly described.

Referring to FIGS. 10 and 11, the display device DD may include the window WIN and the display panel DP. The window WIN is an example of a transparent protector that may protect the display panel DP from external scratches and impacts. The window WIN may be attached to the display panel DP by an adhesive portion AP. As an example, the adhesive portion AP may include a pressure sensitive adhesive (PSA).

The display panel DP may have a substantially rectangular shape having short sides in the first direction DR1 and long sides in the second direction DR2 intersecting the first direction DR1.

The display panel DP may be a light emitting type display panel, however, the exemplary embodiments are not be particularly limited. For instance, the display panel DP may be an organic light emitting display panel or a quantum dot light emitting display panel. A light emitting layer of the organic light emitting display panel may include an organic light emitting material. A light emitting layer of the quantum dot light emitting display panel may include a quantum dot or a quantum rod. Hereinafter, the organic light emitting display panel will be described as the display panel DP for convenience.

The display panel DP may include a substrate SUB, a pixel layer PXL disposed on the substrate SUB, and a thin film encapsulation layer TFE disposed on the substrate SUB to is cover the pixel layer PXL. The substrate SUB may be a transparent substrate and may include a flexible plastic substrate. For example, the substrate SUB may include polyimide (PI).

The pixel layer PXL may be disposed on the substrate SUB. The pixel layer PXL may include a plurality of pixels, and each pixel may include a light emitting element.

The thin film encapsulation layer TFE may include at least two inorganic layers and an organic layer disposed between the inorganic layers. The inorganic layers may include an inorganic material and may protect the pixel layer PXL from moisture and oxygen. The organic layer may include an organic material and may protect the pixel layer PXL from a foreign substance such as dust particles.

Figure 12:
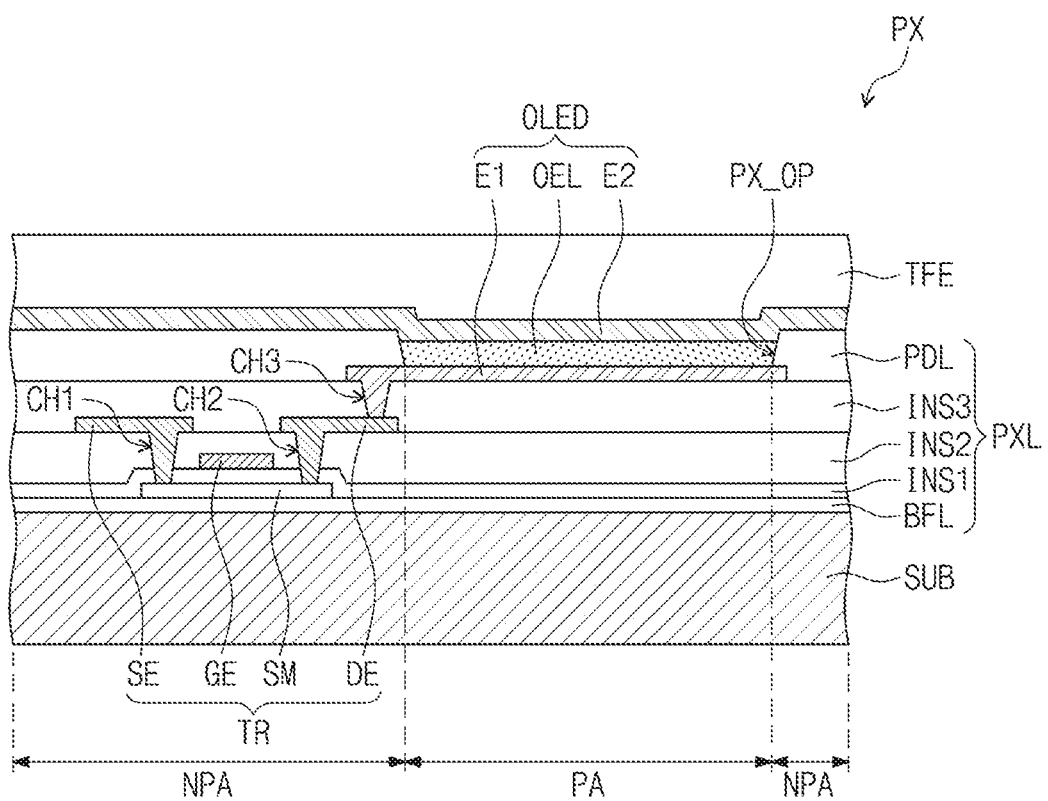
FIG. 12 is a cross-sectional view of an exemplary embodiment of a representative pixel of the pixel layer of FIG. 11.

FIG. 12 is a cross-sectional view of an exemplary embodiment of a representative pixel of the pixel layer of FIG. 11.

Referring to FIG. 12, the pixel PX may include a light emitting element OLED and a transistor TR connected to the light emitting element OLED. The light emitting element OLED may include a first electrode E1, a second electrode E2, and an organic light emitting layer OEL disposed between the first electrode E1 and the second electrode E2. The light emitting element OLED may be defined as an organic light emitting element.

The first electrode E1 may be an anode electrode, and the second electrode E2 may be a cathode electrode. The first electrode E1 may be defined as a pixel electrode, and the second electrode E2 may be defined as a common electrode.

The pixel PX may include a pixel area PA and a non-pixel area NPA around the pixel area PA. The light emitting element OLED may be disposed in the pixel area PA and the transistor TR may be disposed in the non-pixel area NPA.

The transistor TR and the light emitting element OLED may be disposed on the is substrate SUB. A buffer layer BFL may be disposed on the substrate SUB, and the buffer layer BFL may include an inorganic material.

A semiconductor layer SM of the transistor TR may be disposed on the buffer layer BFL. The semiconductor layer SM may include an inorganic semiconductor, such as amorphous silicon or polycrystalline silicon, or an organic semiconductor. In addition, the semiconductor layer SM may include oxide semiconductor. Although not shown in figures, the semiconductor layer SM may include a source area, a drain area, and a channel area defined between the source area and the drain area.

A first insulating layer INS1 may be disposed on the buffer layer BFL to cover the semiconductor layer SM. The first insulating layer INS1 may include an inorganic material.

A gate electrode GE of the transistor TR may be disposed on the first insulating layer INS1 to overlap the semiconductor layer SM. The gate electrode GE may be disposed to overlap the channel area of the semiconductor layer SM.

A second insulating layer INS2 may be disposed on the first insulating layer INS1 to cover the gate electrode GE. The second insulating layer INS2 may include an organic material and/or an inorganic material.

A source electrode SE and a drain electrode DE of the transistor TR may be disposed on the second insulating layer INS2 to be spaced apart from each other. The source electrode SE may be connected to the source area of the semiconductor layer SM through a first contact hole CH1 defined through the first insulating layer INS1 and the second insulating layer INS2. The drain electrode DE may be connected to the drain area of the semiconductor layer SM through a second contact hole CH2 defined through the first insulating layer INS1 and the second insulating layer INS2.

A third insulating layer INS3 may be disposed on the second insulating layer INS2 to cover the source electrode SE and the drain electrode DE of the transistor TR. The third insulating layer INS3 may be defined as a planarization layer that provides a flat upper surface and may include an organic material.

The first electrode E1 may be disposed on the third insulating layer INS3. The first electrode E1 may be connected to the drain electrode DE of the transistor TR through a third contact hole CH3 defined through the third insulating layer INS3.

A pixel definition layer PDL may be disposed on the first electrode E1 and the third insulating layer INS3 to expose a portion of the first electrode E1. An opening PX_OP may be defined through the pixel definition layer PDL to expose the portion of the first electrode E1.

The organic light emitting layer OEL may be disposed on the first electrode E1 in the opening PX_OP. The organic light emitting layer OEL may generate a light having a red, green, or blue color, however, it should not be limited thereto or thereby. The organic light emitting layer OEL may generate a white light by combining organic materials respectively generating the red, green, and blue colors.

The second electrode E2 may be disposed on the pixel definition layer PDL and the organic light emitting layer OEL. The thin film encapsulation layer TFE may be disposed on the light emitting element OLED to cover the pixel PX. The layers between the substrate SUB and the thin film encapsulation layer TFE may be defined as the pixel layer PXL.

Voltages may be respectively applied to the first electrode E1 and the second electrode E2. Holes and electrons are injected into the organic light emitting layer OEL and are recombined in the organic light emitting layer OEL to generate excitons. The excitons may emit the light when an excited state of the excitons returns to a ground state. The light emitting is element OLED may emit lights of the red, green, and blue colors in accordance with a flow of current, and thus, the image may be displayed.

Figure 13:
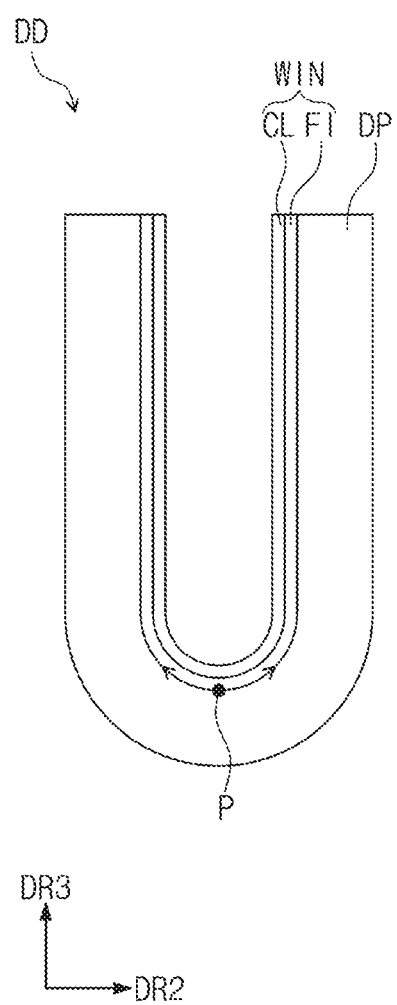
FIG. 13 is a side view of the display device of FIG. 10 in a folded position.

FIG. 13 is a side view of the display device of FIG. 10 in a folded position. For the convenience of explanation, the adhesive portion AP is omitted in FIG. 13.

Referring to FIG. 13, the display device DD is folded about the short axis. As the display device DD is folded, the tensile stress may occur in one surface of the window film FI of the window WIN. The one surface of the window WIN may be a surface that faces and makes contact with the display panel DP.

When the display device DD is repeatedly folded and unfolded, the one surface of the window film FI may be deformed. The deformation of the window film FI causes a deterioration in durability of the flexible display device DD.

In an exemplary embodiment, as the window film FI having the above-described material property conditions is applied to a flexible display device such as the display device DD, the durability of the flexible display device may be improved. This will be described in detail with reference to Table 1 and Table 2 below.

Table 1 shows test results of material properties of plural window films A to E. The material properties of the window films A to E according to Table 1 correspond to the results of the tests performed on the window films A to E before the window films A to E are applied to the flexible display device.

Table 2 shows test results for the deformation of the window films A to E shown in Table 1 applied to the flexible display device. An initial strain amount and a permanent strain amount of Table 2 are measured at a point P shown in FIG. 13. When the display device DD is folded, the point P corresponds to a portion on which the greatest tensile stress acts in a foldable is portion of the window film FI. The initial strain amount may be measured right after the folded display device DD is unfolded. The permanent strain amount may be measured after a predetermined time elapses from a time point at which the initial strain amount is measured. The strain amount of the window film may not be further reduced after the predetermined time elapses.

TABLE 1

| Experimental example | Yield strain (%) | Restoration rate (%) | Plastic index | Creep strain (%) | Creep residual strain (%) |
|---|---|---|---|---|---|
| A | 2.14 | 88 | 0.66 | 20 | 19 |
| B | 2.02 | 92 | 0.6 | 17.5 | 8 |
| C | 1.97 | 94 | 0.51 | 10 | 15 |
| D | 1.53 | 78 | 0.39 | 47 | 28.5 |
| E | 1.83 | 88 | 0.48 | 40 | 10 |

Referring to Table 1, the window films, A, B, and C satisfied the above-described material property conditions. In detail, the window film A may have a yield strain of about 2.14%, a restoration rate of about 88%, a plastic index of about 0.66, a creep strain of about 20%, and a creep residual strain of about 19%. The window film B may have a yield strain of about 2.02%, a restoration rate of about 92%, a plastic index of about 0.6, a creep strain of about 17.5%, and a creep residual strain of about 8%. The window film C may have a yield strain of about 1.97%, a restoration rate of about 94%, a plastic index of about 0.51, a creep strain of about 10% and a creep residual strain of about 15%.

Consequently, the window films A, B, and C satisfied all the material property conditions of the yield strain from about 1.9% to about 2.25%, the restoration rate from about 85% to about 100%, the plastic index equal to or greater than about 0.5, the creep strain from about 0% to about 20%, and the creep residual strain from about 0% to about 20%.

On the other hand, the window film D had a yield strain of about 1.53%, a restoration rate of about 78%, a plastic index of about 0.39, a creep strain of about 47%, and a is creep residual strain of about 28.5%. The window film E had a yield strain of about 1.83%, a restoration rate of about 88%, a plastic index of about 0.48, a creep strain of about 40%, and a creep residual strain of about 10%.

Consequently, the window films D and E did not satisfy the above material property conditions.

Then, the window films A to E having the above material properties were actually applied to the flexible display device, and the strain amount was observed.

The suitability of the window film may be determined by whether the deformed portion is visible to the outside. In a case where the user may observe the deformation of the window film from the outside, the window film is unsuitable for the flexible display device.

In detail, when the initial strain amount of the window film is equal to or smaller than about 20 micrometers and the permanent strain amount of the window film is equal to or smaller than about 4 micrometers, the deformation of the window film was not visible to the viewer and the window film may be suitable for the flexible display device. When the initial strain amount of the window film is greater than about 20 micrometers and the permanent strain amount of the window film is greater than about 4 micrometers, it was determined that the deformation of the window film was viewed from the outside.

TABLE 2

| Experimental example | Initial strain amount (μm) | Permanent strain amount (μm) | suitability |
|---|---|---|---|
| A | 18.2 | 2.5 | ○ |
| B | 19.8 | 4 | ○ |

TABLE 2-continued

| Experimental example | Initial strain amount (μm) | Permanent strain amount (μm) | suitability |
|---|---|---|---|
| C | 18.4 | 3.6 | ○ |
| D | 22.7 | 9 | X |
| E | 20.2 | 4.6 | X |

Referring to Table 2, the window films A, B, and C are suitable for use in the flexible display device. In detail, the initial strain amount and the permanent strain amount of the window film A are about 18.2 μm and about 2.5 μm, respectively. The initial strain amount and the permanent strain amount of the window film B are about 19.8 μm and about 4 μm, respectively. The initial strain amount and the permanent strain amount of the window film C are about 18.4 μm and about 3.6 μm, respectively. The initial strain amounts of the window films A, B, and C were smaller than about 20 μm. The permanent strain amounts of the window films A, B, and C were equal to or smaller than about 4 μm.

On the other hand, the window films D and E are unsuitable for use in the flexible display device. In detail, the initial strain amount and the permanent strain amount of the window film D are about 22.7 μm and about 9 μm, respectively. The initial strain amount and the permanent strain amount of the window film E are about 20.2 μm and about 4.6 μm, respectively. The initial strain amounts of the window films D and E were greater than about 20 μm, and the permanent strain amounts of the window films D and E were greater than about 4 μm.

As such, each of the window films A, B, and C having the material property conditions according to exemplary embodiments of the invention reduces the deformation that exists when the corresponding flexible display device is unfolded. Consequently, the window is films A, B, and C are suitable films since a deformed portion of the window films A, B, and C is not perceived from the outside. The window films D and E are unsuitable films since a deformed portion of the window films D and E is viewed from the outside.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A window for a display device, the window comprising:
a film having flexibility; and
at least one coating layer disposed on the film, wherein:
as tensile stress acting on the film increases, the film is elastically deformed in a first range of strains of the film, the strains of the film in the first range having a linear relationship with the tensile stress, and plastically deformed in a second range of strains of the film greater than the first range, the strains of the film in the second range having a non-linear relationship with the tensile stress; and
as maximum tensile stress, a yield stress, in the first range is applied to the film, the film has a yield strain in a third range from about 1.9% to about 2.25%, wherein the yield strain is determined by comparing the shape of the film after the yield stress is applied to the film with the shape of the film before the tensile stress is applied,
wherein the film satisfies all of the following material property conditions:
(1) the yield strain: a range from about 1.9% to about 2.25%,
(2) a plastic index: equal to or greater than about 0.5,
(3) a restoration rate: a range from about 85% to about 100%,
(4) a creep strain: a range from about 0% to about 20%, and
(5) a creep residual strain: a range from about 0% to about 20%.

2. The window of claim 1, wherein the film has the tensile stress-film deformation curve in the first and second ranges,
in the first range, the tensile stress-film deformation curve has a first slope defined as an elastic modulus,
in the second range, the tensile stress-film deformation curve has a second slope defined as a plastic modulus, and
the plastic index is defined by a value obtained by dividing the plastic modulus by the elastic modulus.

3. The window of claim 2, wherein the plastic modulus is defined by a slope at a designated strain selected from the second range, and the designated strain is set to a value in a fourth range from the yield strain to the strain of the film which is about 2.75%.

4. The window of claim 3, wherein the fourth range comprises a fifth range of strains of the film which is from about 2.25% to about 2.75%.

5. The window of claim 1, wherein the film has the restoration rate after a tensile stress is applied to the film multiple times, the restoration rate is defined by a numerical value obtained by dividing a restoration strain by a first set strain, and the restoration strain is defined by a value obtained by subtracting the strain of the film, which is measured after the tensile stress is applied multiple times, from the first set strain.

6. The window of claim 1, wherein the film has the creep strain when a stress is applied to the film during a first time and the stress is released after the first time, the creep strain is defined by a numerical value obtained by dividing an additional strain by a second set strain, and the additional strain is defined as a variation of the strain of the film in response to the stress being continuously applied from the second set strain.

7. The window of claim 6, wherein the creep residual strain is defined by a numerical value obtained by dividing a residual strain by the second set strain, and the residual strain is defined as the strain of the film after a second time elapses after the stress is released.

8. The window of claim 1, wherein the film comprises at least one monomer of oxydiphthalic anhydride (ODPA), pyromellitic dianhydride (PMDA), oxy diphtalic anhydride (ODA), bis-aminophenoxy biphenyl (BAPB), and bis-amino phenoxy phenylsulfone (BAPS).

9. The window of claim 8, wherein the film comprises at least one polymer of polyimide (PI), polyethylene terephthalate (PET), polycarbonate (PC), and polymethyl methacrylate (PMMA).

10. A display device comprising:
a display panel; and
a transparent protector disposed on the display panel, the transparent protector comprising:
a film having a flexibility; and
at least one coating layer disposed on the film, wherein:
as tensile stress acting on the film increases, the film is elastically deformed in a first range of strains of the film, the strains of the film in the first range having a linear relationship with the tensile stress, and plastically deformed in a second range of strains of the film greater than the first range, the strains of the film in the second range having a non-linear relationship with the tensile stress; and as maximum tensile stress, a yield stress, in the first range is applied to the film, the film has a yield strain in a third range from about 1.9% to about 2.25%, wherein the yield strain is determined by comparing the shape of the film after the yield stress is applied to the film with the shape of the film before the tensile stress is applied, wherein the film satisfies all of the following material property conditions:

(1) the yield strain: a range from about 1.9% to about 2.25%,
(2) a plastic index: equal to or greater than about 0.5,
(3) a restoration rate: a range from about 85% to about 100%,
(4) a creep strain: a range from about 0% to about 20%, and
(5) a creep residual strain: a range from about 0% to about 20%.

11. The display device of claim 10, wherein the film has the tensile stress-film deformation curve in the first and second ranges, in the first range, the tensile stress-film deformation curve has a first slope defined as an elastic modulus, in the second range, the tensile stress-film deformation curve has a second slope defined as a plastic modulus, and the plastic index is defined by a value obtained by dividing the plastic modulus by the elastic modulus.

12. The display device of claim 11, wherein the plastic modulus is defined by a slope at a designated strain selected from the second range, and the designated strain is set to a value in a fourth range from the yield strain to the strain of the film which is about 2.75%.

13. The display device of claim 12, wherein the fourth range comprises a fifth range of strains of the film which is from about 2.25% to about 2.75%.

14. The display device of claim 10, wherein the film has the restoration rate after a tensile stress is applied to the film multiple times, the restoration rate is defined by a numerical value obtained by dividing a restoration strain by a first set strain, and the restoration strain is defined by a value obtained by subtracting the strain of the film, which is measured after the tensile stress is applied multiple times, from the first set strain.

15. The display device of claim 10, wherein the film has creep strain when a stress is applied to the film during a first time and the stress is released after the first time, the creep strain is defined by a numerical value obtained by dividing an additional strain by a second set strain, and the additional strain is defined as a variation of the strain of the film in response to the stress being continuously applied from the second set strain.

16. The display device of claim 15, wherein the creep residual strain is defined by a numerical value obtained by dividing a residual strain by the second set strain, and the residual strain is defined as the strain of the film after a second time elapses after the stress is released.

17. The display device of claim 10, wherein the yield strain is the maximum value in the first range of strains of the film.

18. The display device of claim 10, wherein the transparent protector comprises a window and the film comprises a window film.

* * * * *